United States Patent [19]

Numasawa

[11] Patent Number: 5,256,455
[45] Date of Patent: Oct. 26, 1993

[54] METHOD OF FORMING FILM OF TANTALUM OXIDE BY PLASMA CHEMICAL VAPOR DEPOSITION

[75] Inventor: Youichirou Numasawa, Tokyo, Japan
[73] Assignee: NEC Corporation, Tokyo, Japan
[21] Appl. No.: 825,975
[22] Filed: Jan. 27, 1992
[30] Foreign Application Priority Data
  Feb. 7, 1991 [JP]  Japan .................................. 3-016208
[51] Int. Cl.$^5$ .................... B05D 3/06; C23C 16/00
[52] U.S. Cl. ..................... 427/576; 427/126.3; 427/255; 427/255.3; 427/569
[58] Field of Search ............... 427/38, 39, 255.3, 255, 427/126.3, 569, 576

[56] References Cited

U.S. PATENT DOCUMENTS 4,987,005  1/1991  Suzuki et al. .................... 427/38

OTHER PUBLICATIONS

Y. Numasawa et al., "International Electron Devices Meeting 1989 Technical Digest", pp. 43-46, issued by the Electron Device Society of IEEE.

Primary Examiner—Shrive Beck
Assistant Examiner—David M. Maiorana
Attorney, Agent, or Firm—Laff, Whitesel, Conte & Saret

[57] ABSTRACT

A method for depositing a thin film of tantalum oxide ($Ta_2O_5$) with a large capacitance per unit area on a silicon surface by a plasma CVD process. The plasma used in the CVD process is generated by a high-frequency energy with a gas containing tantalum chloride ($TaCl_5$) and dinitrogen oxide ($N_2O$). The intensity of the high-frequency energy increases from the start of the formation of the film of tantalum oxide until the end of the formation of the film. Increasing the intensity of the energy causes suppression of the growth of silicon oxide layers which are generated with the reactive plasma sputtering process going at the same time with the CVD process on the silicon surface.

7 Claims, 3 Drawing Sheets

METHOD OF FORMING FILM OF TANTALUM OXIDE BY PLASMA CHEMICAL VAPOR DEPOSITION

BACKGROUND OF THE INVENTION

1. Field of the Invention:

The present invention relates to a method of forming a film of tantalum oxide on a substrate by plasma chemical vapor deposition, and more particularly to a method of forming a thin film of tantalum oxide having a high dielectric constant on a semiconductor substrate.

2. Description of the Related Art:

The fabrication of DRAMs (dynamic random access memories) having a storage capacity of 64 megabits (67,108,864 bits) or more requires that a film of tantalum (V) oxide ($Ta_2O_5$) be formed as an insulation film of a high dielectric constant in the capacitance region of each memory cell of the DRAM. Heretofore, sputtering and chemical vapor deposition (CVD) are known to form a film of tantalum oxide on a substrate.

One example of a process of forming a film of tantalum oxide by CVD is a thermal CVD process using tantalum pentaethoxide and oxygen as reported by H. Shinriki et al. on page 25 of "1989 SYMPOSIUM ON VLSI TECHNOLOGY DIGEST OF TECHNICAL PAPERS" issued by the Electron Device Society of IEEE. A plasma CVD process which employs tantalum (V) chloride ($TaCl_5$) and dinitrogen monoxide ($N_2O$) is reported by Y. Numasawa et al. on page 43 of "INTERNATIONAL ELECTRON DEVICES MEETING 1989 TECHNICAL DIGEST" issued by the Electron Device Society of IEEE.

Of the above processes for forming films of tantalum (V) chloride and dinitrogen monoxide is capable of forming films of better characteristics for use in the capacitance regions of memory cells. One conventional method of forming a film of tantalum oxide according to the plasma CVD process employing tantalum (V) chloride and dinitrogen monoxide will be described below with reference to FIG. 1 of the accompanying drawings. The plasma CVD system shown in FIG. 1 generates a plasma with high frequencies, and is known to a person of ordinary skill in the art.

As shown in FIG. 1, a certain quantity of tantalum (V) chloride ($TaCl_5$), which is solid at room temperature, is placed in a cylinder 108, and heated therein by a temperature regulator 107, generating a vapor of tantalum (V) chloride. The generated vapor of tantalum (V) chloride is introduced with a carrier gas of argon through a filter 106 and a pipe into a plasma reaction chamber 101. The pipe is equipped with a pipe heater 105 which prevents the vapor of tantalum (V) chloride from being condensed.

The plasma reaction chamber 101 is evacuated by an evacuating system 110. The plasma reaction chamber 101 houses a susceptor 103 and a plasma electrode 102 that are disposed in confronting relationship to each other. The susceptor 103 serves to hold a silicon substrate 111 on which a film of tantalum oxide is to be deposited. The plasma electrode 102 is electrically connected to a high-frequency generator 104. The high-frequency generator 104 applies a high-frequency energy to the plasma electrode 102 to generate a plasma between the plasma electrode 102 and the susceptor 103, thereby forming a film of tantalum oxide on the silicon substrate 111.

The film of tantalum oxide thus formed on the silicon substrate 111 according to the above plasma CVD process has an electric capacitance of less than 10 fF per 1 $um^2$. If the film were used in the capacitance region of a memory cell, it would not be able to reduce the area of the capacitance region. One reason is that oxidizing plasma sputtering progresses at the same time as the plasma CVD reaction particularly in the initial stage of the formation of a film of tantalum oxide. As a result, when a film of tantalum oxide is formed on a silicon substrate, the surface of the silicon substrate is simultaneously oxidized, forming a film of silicon oxide which has a thickness in the range of from 1 to 3 nm. As silicon oxide has a lower dielectric constant than tantalum oxide, the formed film for use as a capacitance film is composed of the film of silicon oxide and the film of tantalum oxide, thereby virtually reducing the capacitance per unit area.

SUMMARY OF THE INVENTION

It is an object of the present invention to provide a method of forming a film of tantalum oxide of good characteristics.

Another object of the present invention is to provide a method of forming a film of tantalum oxide having a large capacitance per unit area on either a silicon substrate or a polycrystalline silicon layer on a silicon substrate by plasma CVD.

Still another object of the present invention is to provide a method of forming a film of tantalum oxide having an electric capacitance of 10 fF or more per 1 $um^2$, for use in a DRAM of 64 megabits or more which requires a capacitor having a large capacitance per unit area.

To achieve the above objects, there is provided in accordance with the present invention a method of forming a film of tantalum oxide on a substrate by plasma chemical vapor deposition in a plasma generated by a high-frequency energy with a gas containing tantalum chloride and dinitrogen oxide, comprising the step of increasing the intensity of the high-frequency energy from the start of formation of the film of tantalum oxide until the end of formation of the film of tantalum oxide.

At the start of formation of the film of tantalum oxide, the intensity of the high-frequency electric energy is relatively low, as is the density of the plasma. As a consequence, the degree of oxidizing plasma sputtering that progresses at the same time as the CVD reaction is relatively low. In the case where a film of tantalum oxide is formed on a silicon substrate, the thickness of a film of silicon oxide formed on the silicon substrate is reduced. Therefore, the capacitance of the film of tantalum oxide per unit area is increased.

The intensity of the high-frequency electric energy may be increased from the start to the end of formation of the film, continuously or in a plurality of steps in each of which the intensity may remain constant. The values of the high-frequency electric energy at the start and the end of formation of the film, and the pressure of the plasma reaction may be selected depending on the film-forming conditions of ordinary CVD processes with electric energies applied at high frequencies including microwave frequencies. The high-frequency electric energy is preferably of a frequency of 4 MHz or higher, and may be selected to be 13.56 MHz or 2.45 GHz, for example, within various legal limitations.

The above and other objects, features and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

Figure 1:
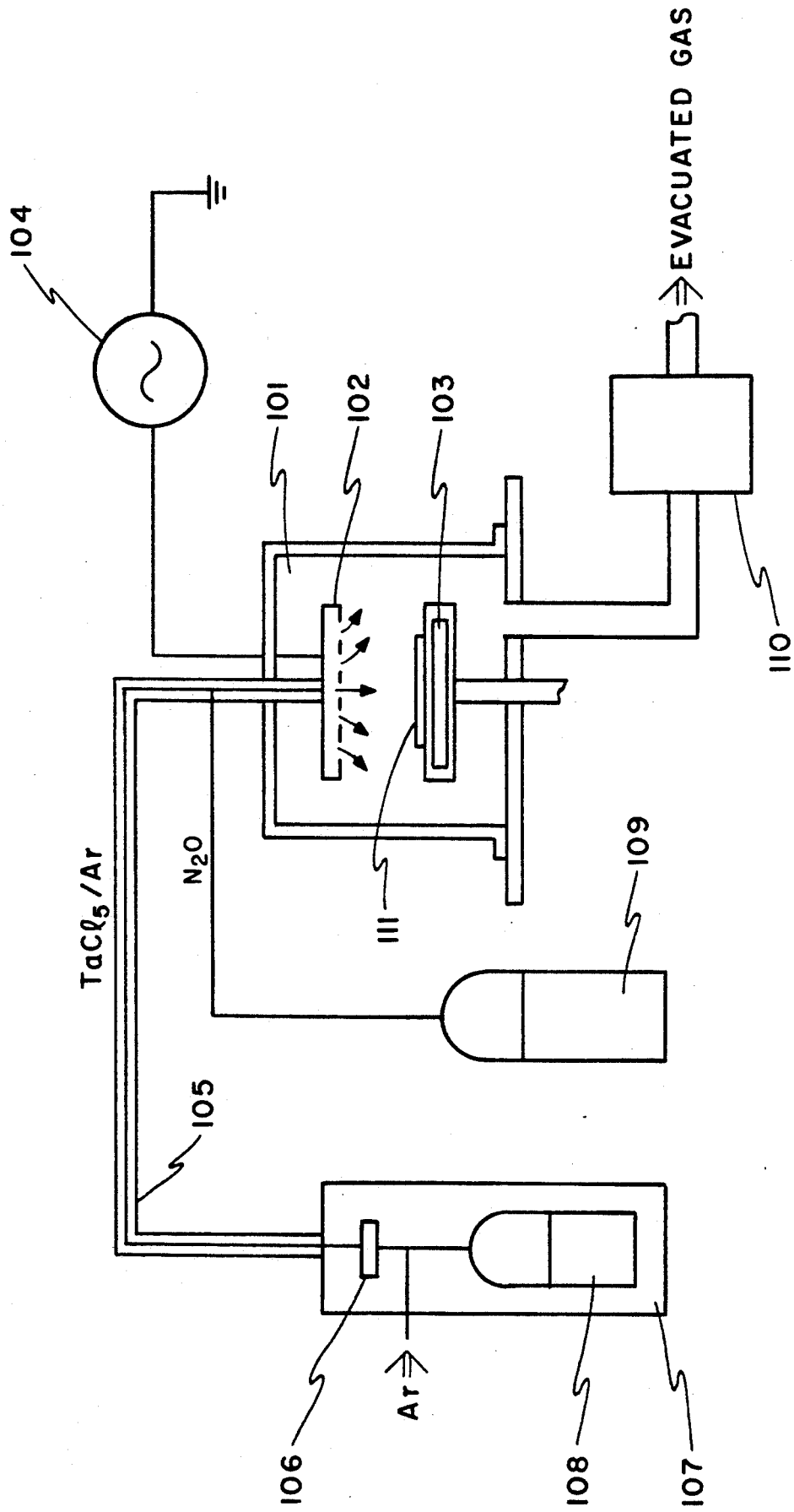
FIG. 1 is a diagram of a high-frequency plasma CVD system for use in a conventional method of forming a film of tantalum oxide.
Figure 2:
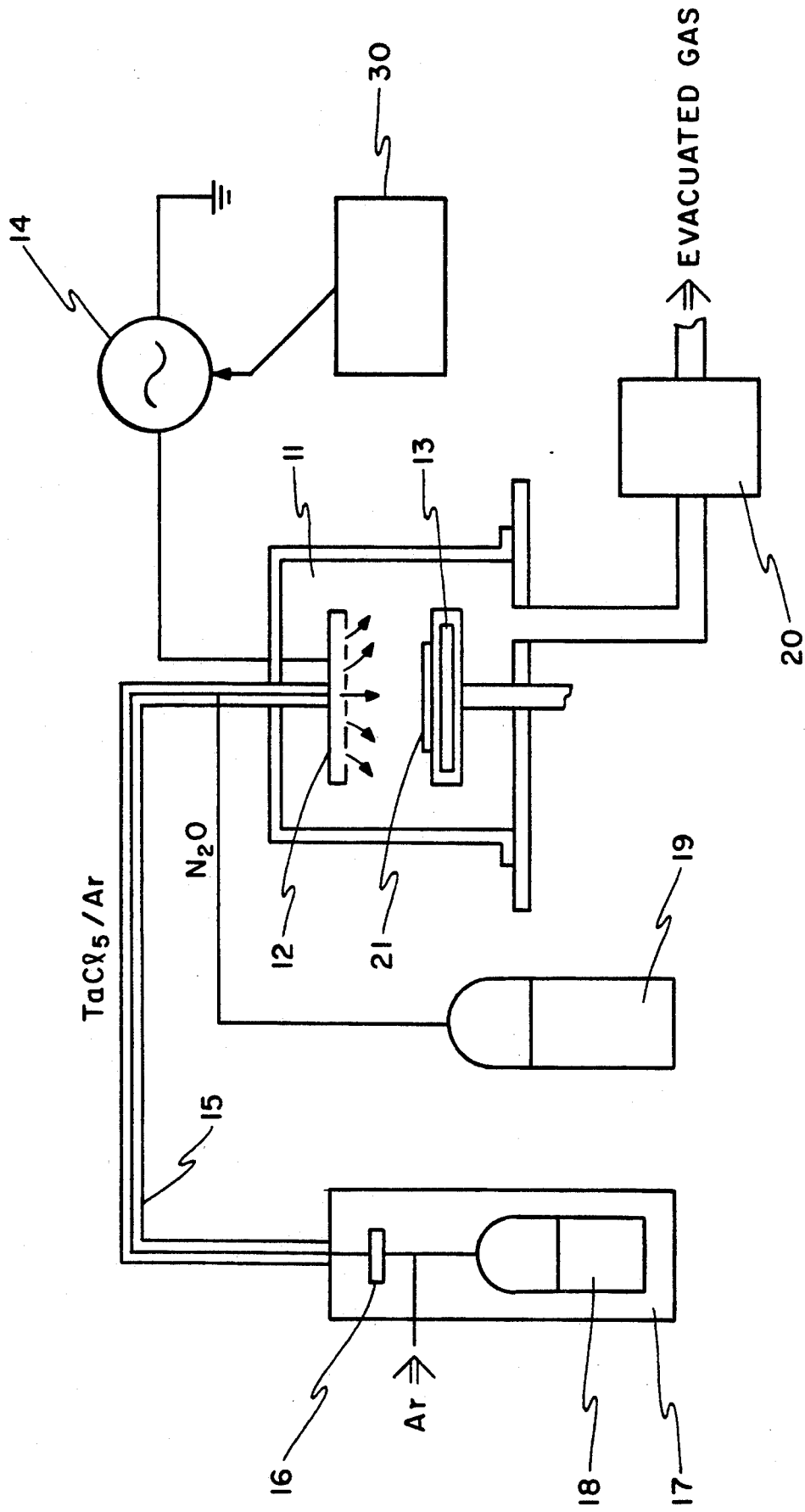
FIG. 2 is a diagram of a high-frequency plasma CVD system for use in a method of forming a film of tantalum oxide according to the present invention.

FIG. 2 shows a high-frequency plasma CVD system for use in a method of forming a film of tantalum oxide according to the present invention. The high-frequency plasma CVD system shown in FIG. 2 differs from an ordinary high-frequency CVD system in that the output energy of a high-frequency generator 14 is controlled by a high-frequency electric energy controller 30. The high-frequency electric energy controller 30 varies the high-frequency output energy of the high-frequency generator 14 in a plurality of steps.

The details of the high-frequency plasma CVD system other than the high-frequency electric energy controller 30 are well known to a person of ordinary skill in the art. More specifically, a plasma reaction chamber 11, which can be evacuated by an evacuating system 20, houses a susceptor 13 for supporting a silicon substrate 21 on which a film is to be deposited, and a plasma electrode 12 electrically connected to the high-frequency generator 14. The susceptor 13 and the plasma electrode 12 are disposed in a parallel, confronting relationship to each other. The plasma electrode 12 has a number of holes defined in a surface thereof for introducing a film-forming gas therethrough into the plasma reaction chamber 11.

A certain quantity of tantalum (V) chloride ($TaCl_5$), which is solid at room temperature, is placed in a cylinder 18 which is housed in a temperature regulator 17 that heats the cylinder 18. A vapor of tantalum chloride which is evaporated in the heated cylinder 18 is mixed with a carrier gas of argon (Ar) in the temperature regulator 17. The mixture gas is then supplied through a filter 16 and a pipe heated by a pipe heater 15 into the plasma reaction chamber 11 through the holes defined in the plasma electrode 12. An oxidizing gas of dinitrogen monoxide ($N_2O$), which is stored in a cylinder 19, is supplied through a pipe connected to the cylinder 19 into the pipe from the temperature regulator 17, immediately before the plasma reaction chamber 11. As is well known in the art, the carrier gas may be of nitrogen ($N_2$), helium (He) or xenon (Xe), other than argon.

Using the high-frequency plasma CVD system shown in FIG. 2, a film of tantalum oxide was formed as follows:

The cylinder 18 containing a certain quantity of tantalum (V) chloride ($TaCl_5$) was heated to 160° C. by the temperature regulator 17, thus generating a vapor or gas of tantalum chloride. The gas of tantalum chloride was then mixed with a carrier gas of argon, and the mixture gas was supplied to the plasma reaction chamber 11. An oxidizing gas of dinitrogen monoxide ($N_2O$) was supplied from the cylinder 19, and mixed with the mixture gas of tantalum chloride and argon immediately before the plasma reaction chamber 11. The mixed gas was then introduced into the plasma reaction chamber 11.

The gas of tantalum chloride was supplied at a rate of 10 sccm, and the gas of dinitrogen monoxide at a rate of 100 sccm. The pressure in the plasma reaction chamber was 0.6 Torr. A silicon substrate 21 supported by the susceptor 13 was heated to 450° C. by a heater (not shown).

Figure 3:
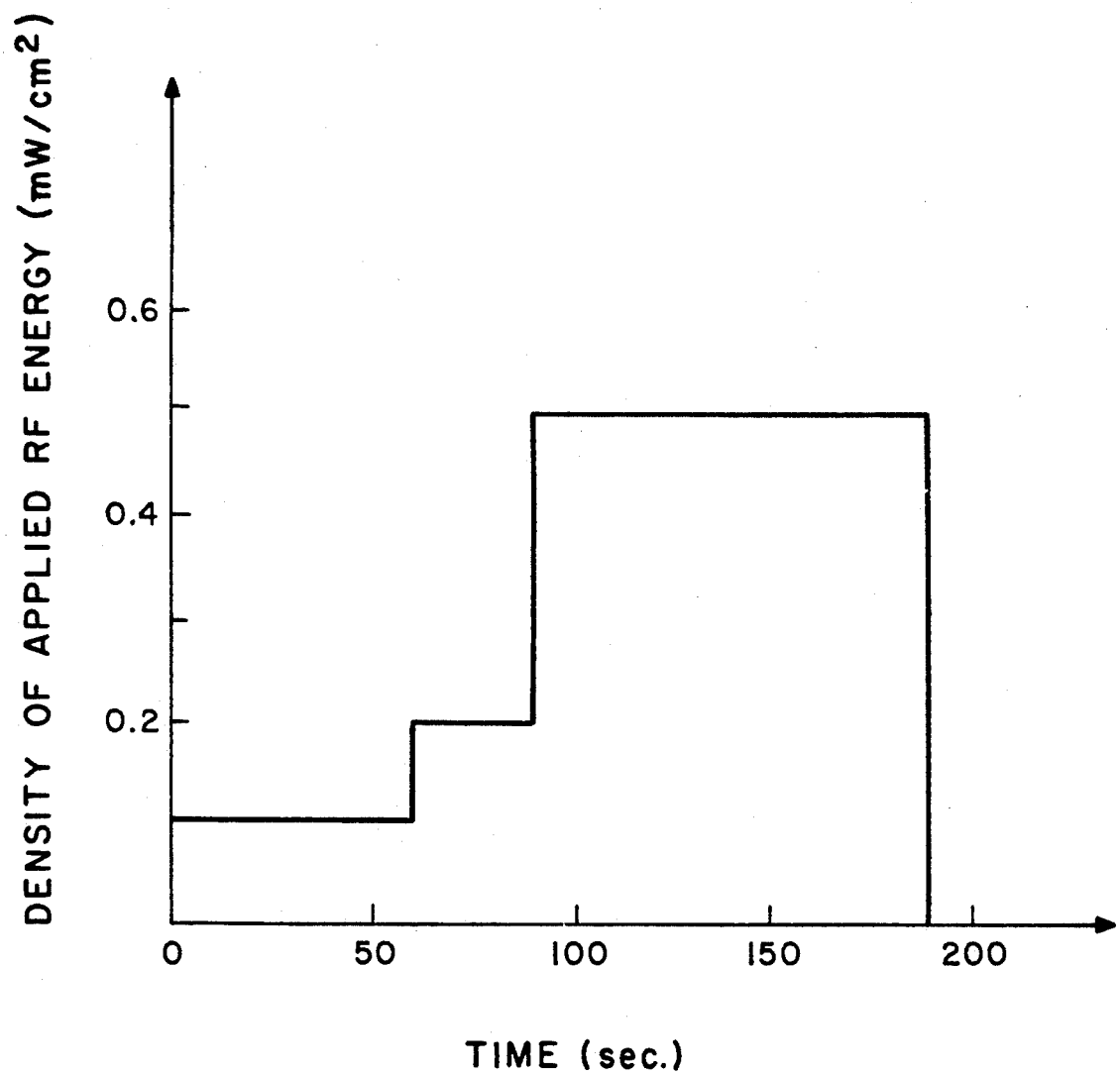
FIG. 3 is a graph showing the manner in which the density of high-frequency electric energy varies with time.

Then, a high-frequency electric energy was generated at a frequency of 13.56 MHz by the high-frequency generator 14, and applied between the plasma electrode 12 and the susceptor 13. To vary the density of the applied high-frequency electric energy, the high-frequency electric energy controller 30 controlled the intensity of the high-frequency electric energy applied from high-frequency generator 14 to the plasma electrode 12 in three successive steps. The density of the applied high-frequency generator 14 to the plasma electrode 12 in three successive steps. The density of the applied high-frequency electric energy was calculated by dividing the intensity of the high-frequency electric energy applied to the plasma electrode 12 by the area of the plasma electrode 12. Specifically, as shown in FIG. 3, the high-frequency electric energy was applied to the plasma electrode 12 at a density of 0.1 $mW/cm^2$ for the first 60 seconds from the start of the formation of the film. Then, the high-frequency electric energy was applied to the plasma electrode 12 at a density of 0.2 $mW/cm^2$ for the next 30 seconds, and to the plasma electrode 12 at a density of 0.5 $mW/cm^2$ for the last 100 seconds in the film formation.

According to the above process, a film of tantalum oxide was formed on a silicon substrate (or a polycrystalline silicon layer on a silicon substrate) for use as one element in the capacitance region of a memory cell of a semiconductor memory. The formed film of tantalum oxide was then measured in various ways to check the effectiveness of the present invention. First, the interface between the film of tantalum oxide and the silicon substrate was checked using a transmission electron microscope (TEM). As a result, it was found that the film of silicon oxide formed in the interface had a very small thickness of 1 nm or less according to the present invention, whereas the film of silicon oxide formed in the interface according to the conventional process a the constant density of high-frequency electric energy was about 2.5 nm thick.

A film of tantalum oxide having a thickness of about 7 nm was formed on a polycrystalline silicon electrode, and then an aluminum plate electrode was formed on the film of tantalum oxide. The characteristics of the capacitance region between the polycrystalline silicon electrode and the aluminum plate electrode were then electrically evaluated. As a consequence, it was found from the capacitance-voltage (C-V) characteristics that it was possible to produce a capacitor of 18 fF per 1 $um^2$ with the film of tantalum oxide.

According to the above embodiment, therefore, in the case where a film of tantalum oxide is formed on a silicon substrate or a polycrystalline silicon layer, the thickness of a layer of silicon oxide in the interface therebetween is 1 nm or less, making it possible to form a film of tantalum oxide having a capacitance of 10 fF or more per 1 $um^2$.

In the illustrated embodiment, the applied high-frequency electric energy is increased in three successive steps. However, the present invention is not limited to the above embodiment, since the applied high-frequency electric energy may be increased in four or more successive steps or may be continuously increased. The values of the high-frequency electric energy at the start and the end of the formation of a film, and the pressure of the plasma reaction may be determined based on the proportion of oxidizing plasma sputtering to CVD reaction or the stability of the plasma, or depending on the film-forming conditions of ordinary CVD processes with electric energies applied at high frequencies including microwave frequencies. The high-frequency electric energy is preferably of a frequency of 4 MHz or higher, and may be selected to be 13.56 Mhz or 2.45 GHz, for example, within various limitations.

Although a certain preferred embodiment of the present invention has been shown and described in detail, it should be understood that various changes and modifications may be made therein without departing from the scope of the appended claims.

What is claimed is:

1. A method of forming a film of tantalum oxide on a substrate by using a plasma chemical vapor deposition in a plasma which is generated by a high-frequency energy and with a gas containing tantalum chloride and dinitrogen oxide, said method comprising the steps of:

increasing the intensity of the high-frequency energy from the start of a formation of the tantalum oxide film until the end of formation of the tantalum oxide film, and maintaining said intensity of the high-frequency at levels which do not decrease during said formation of the film before the termination of said film formation wherein the oxidation of the substrate is reduced during the formation of the film of tantalum oxide.

2. A method according to claim 1, wherein the process of forming the film of tantalum oxide is divided into a plurality of stages, the intensity of the high-frequency energy being increased at the beginning of each of the stages, and the further step of precluding a decrease of said intensity from a time beginning with the start of the formation of the tantalum oxide film and continuing until the end of the formation of the film of tantalum oxide.

3. A method according to claim 1 or 2, including the further step of applying the high-frequency electric energy to an electrode disposed in a plasma reaction chamber, thereby generating the plasma in the plasma reaction chamber.

4. A method according to claim 3, wherein said high frequency electric energy has a frequency of at least 4 MHz.

5. A method according to claim 4, wherein the substrate has at least a surface of silicon.

6. A method according to claim 2, wherein the intensity of the high-frequency energy is substantially fixed during each of the stages.

7. A method of forming a tantalum oxide film on a substrate by a plasma chemical vapor deposition in a plasma generated by a high-frequency energy with a gas containing tantalum chloride and dinitrogen oxide, said method comprising the step of:

dividing the process of film formation into a plurality of stages and increasing the intensity of the high-frequency energy at the beginning of each of the stages, said stages of increasing intensity beginning with a start of the formation of the film and continuing until the end of the formation of the film, said intensity not decreasing between the start and the end of the formation of the film wherein the oxidation of the substrate is reduced during the formation of the film of tantalum oxide.

* * * * *